United States Patent [19]

Heiner

[11] Patent Number: 5,005,766
[45] Date of Patent: Apr. 9, 1991

[54] DEVICE FOR PROVIDING A FLUX LAYER ON A PRINTED BOARD

[75] Inventor: Nicolaas Heiner, Wenum-Wiessel, Netherlands

[73] Assignee: U.S. Philips Corporation, New York, N.Y.

[21] Appl. No.: 401,893

[22] Filed: Aug. 31, 1989

[30] Foreign Application Priority Data

Sep. 15, 1988 [NL] Netherlands .......... 8802266

[51] Int. Cl.$^5$ .............................................. B05B 3/12
[52] U.S. Cl. .................................. 239/214; 239/566
[58] Field of Search ............... 239/214, 220, 221, 556, 239/548, 596, 601, 566

[56] References Cited

U.S. PATENT DOCUMENTS

| | | | |
|---|---|---|---|
| 1,610,782 | 12/1926 | Homan et al. | 239/220 X |
| 1,887,416 | 11/1932 | Matlack | 239/220 X |
| 2,321,172 | 6/1943 | Ayers et al. | 239/556 X |
| 3,108,560 | 10/1963 | Bowne | 239/220 X |
| 3,468,362 | 9/1969 | Burkhardt | 239/556 X |
| 3,589,611 | 6/1971 | Jones | 239/132 |

FOREIGN PATENT DOCUMENTS 50525 1/1941 Netherlands .
2111863 7/1983 United Kingdom .

Primary Examiner—Andres Kashnikow
Assistant Examiner—Kevin Weldon
Attorney, Agent, or Firm—Norman N. Spain

[57] ABSTRACT

The invention relates to a device for providing a flux layer on a printed board in view of a subsequent soldering step. The device comprises a reservoir containing flux and a cylinder (3) accommodated in the said reservoir, which cylinder can be rotated about the horizontal center line (X—X) during operation. A spray tube (10) is accommodated in the cylinder so as to extend parallel to its center line (X—X) and comprises spray apertures (11) in a row which extends in the longitudinal direction of the spray tube and at a given regular pitch. The spray apertures (11) are partly conical with an apex angle α of 60°. The wire-gauze cylinder (3) is seamless.

8 Claims, 3 Drawing Sheets

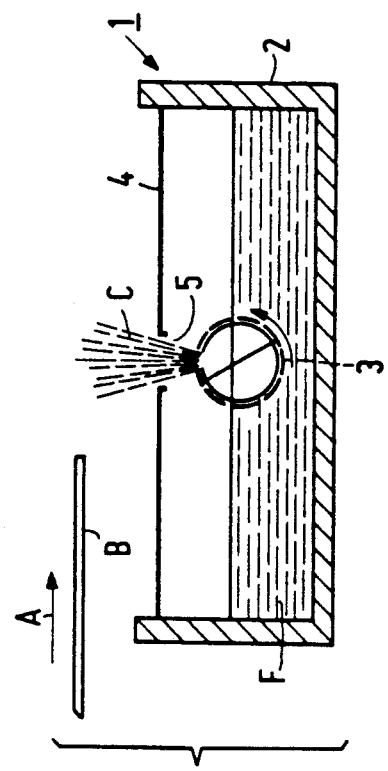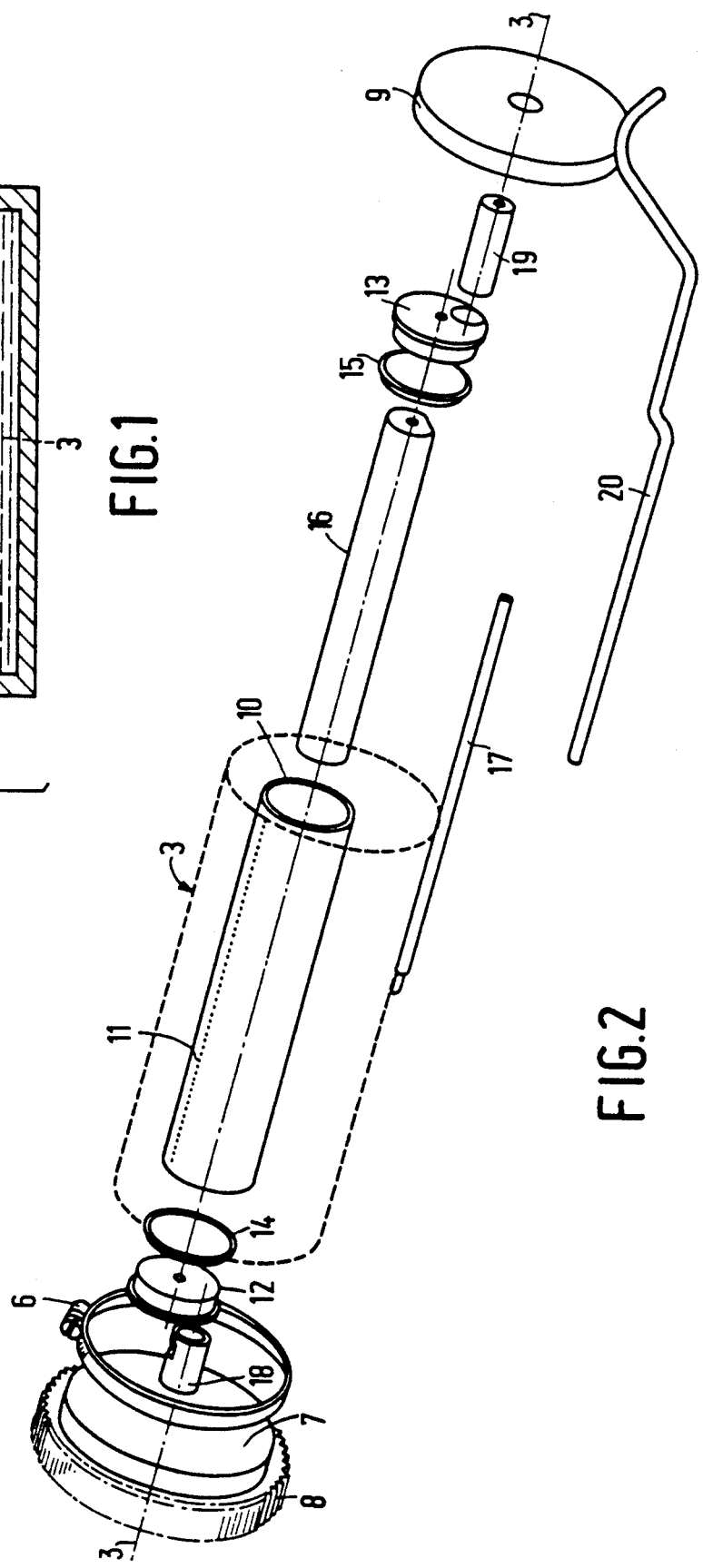

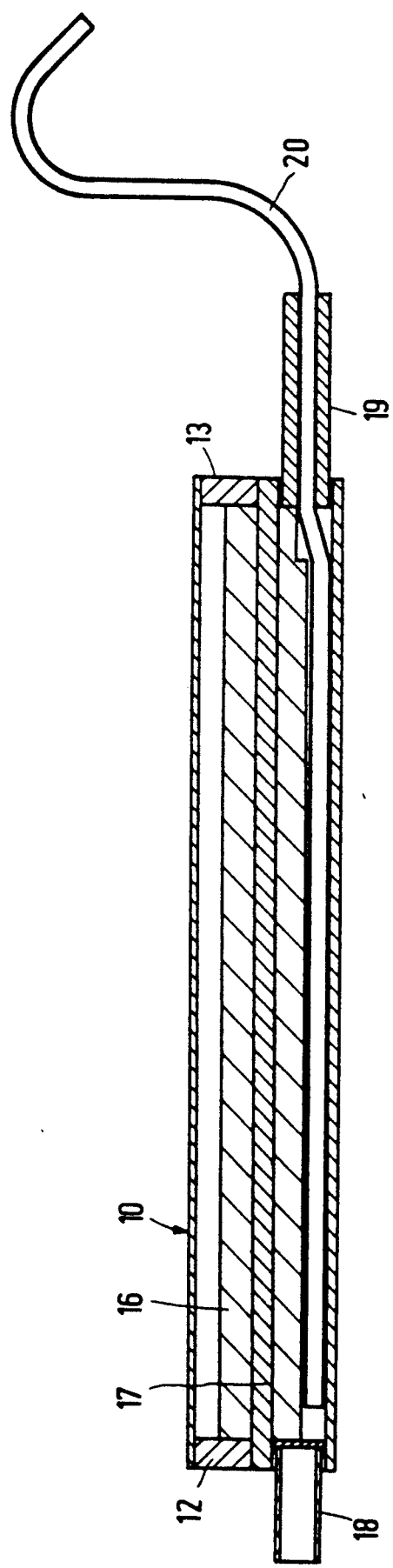

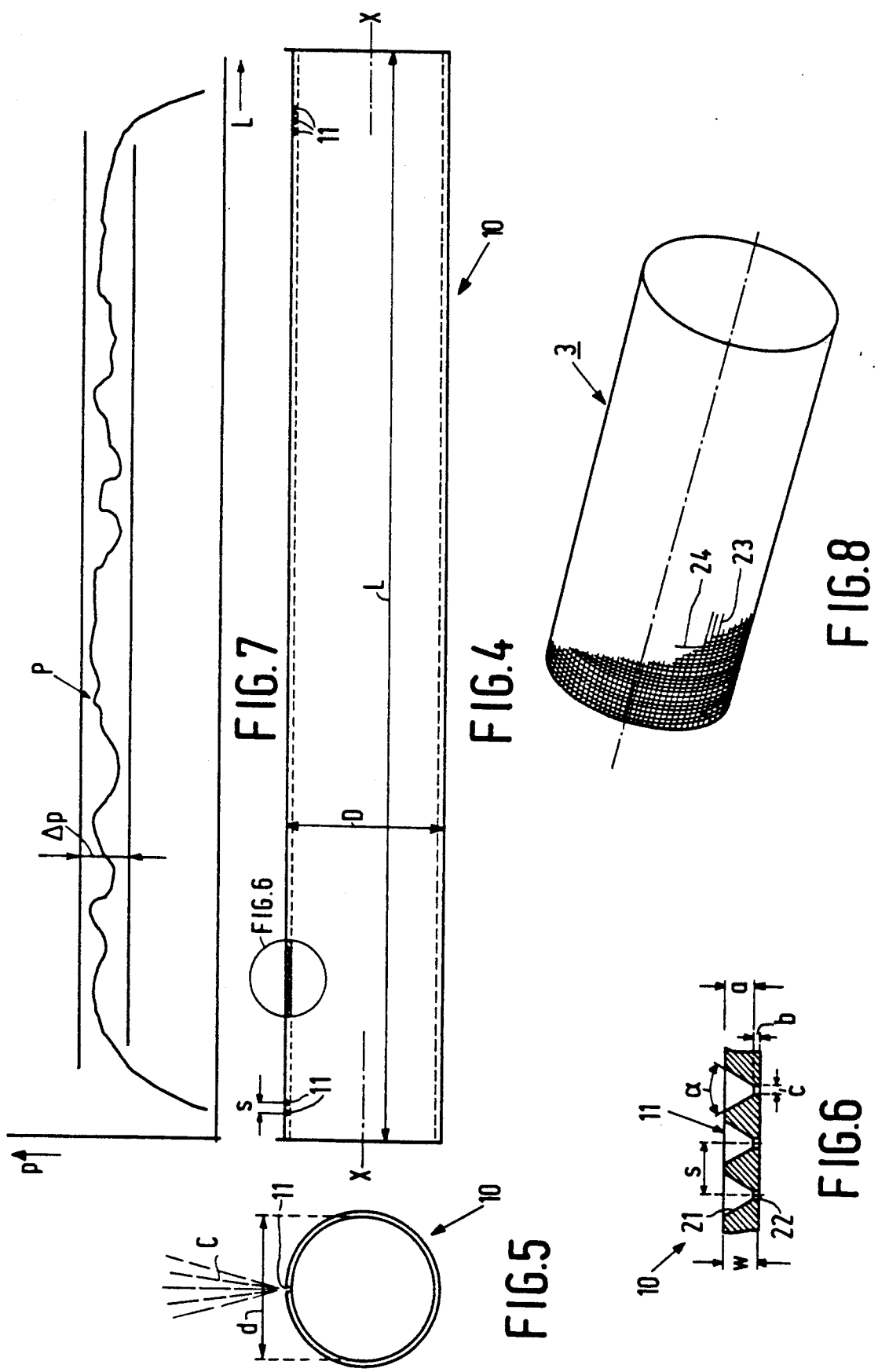

DEVICE FOR PROVIDING A FLUX LAYER ON A PRINTED BOARD

BACKGROUND OF THE INVENTION

The invention relates to a device for providing a flux layer on a printed board, which device comprises a reservoir and a wire-gauze cylinder which is rotatable in the reservoir, while in the cylinder a spray tube extending parallel to its center line is accommodated, into which spray tube the outflow aperture of an air supply line opens and in which spray tube spray apertures have been provided which are arranged in a row extending in the longitudinal direction of the spray tube.

For soldering parts to a printed board it is customary to wet such a panel with a flux with a view to the removal of contaminations and the furthering of the soldering activities. When a device is used as described in the opening paragraph the board is for that purpose moved transversely to the longitudinal direction of the spray tube over the wire-gauze cylinder which rotates during operation and the flux which is dragged along by the cylinder out of the liquid bath in the reservoir is blown against the printed board to be wetted by means of the air flowing out of the spray apertures in the spray tube.

In a known device, which is now commercially available, the spray tube has a small diameter as compared with the diameter of the cylinder and a second duct which extends parallel to the spray tube and is connected to a sources of compressed air is accommodated in the cylinder, which duct communicates with the interior of the spray tube by means of a number of radially extending connecting studs connected to the spray tube. The spray apertures provided in the spray tube for the exhaust of the compressed air have a cylindrical shape.

It has been found in practice that with this known device a regular spray pattern cannot be obtained so that a flux layer of a non-uniform thickness is formed on the board to be wetted, which impedes an efficacious cleaning of the printed board and an effective provision of reliable soldered joints. The non-uniform layer thickness is caused by air whirls and by a non-uniform pressure distribution of the air flowing out of the spray apertures over the length of the tube. The thicker the flux layer, the more residues remain on the wiring panel. Because residues cause contact problems, for example, in the in-circuit-testing of printed boards by means of pin beds, thin flux layers are desired. Because thin flux layers are necessary and desired, the spreading on the layer thickness is of great influence.

SUMMARY OF THE INVENTION

It is therefore the object of the invention to provide a device of the type mentioned hereinbefore by means of which a flux layer which is as thin and uniform as possible can be applied to the printed board.

According to the invention this object is achieved substantially in that the spray apertures are provided at a regular pitch in the wall of the spray tube and are conical at least over a part of their length. Air whirls and air flow effects are avoided by the regular distribution of the spray apertures. Uncontrolled random exhaust of the air is minimized due to the conical shape of the spray apertures obtained by conical drilling (countersinking). By means of these measures a uniform exhaust of air and a uniform pressure distribution is obtained over at least substantially the whole length of the spray tube and hence a uniform spraying of flux from the rotating cylinder in the direction of the printed board, which results in a flux layer of uniform thickness on the printed board.

Mechanical errors and inaccuracies of the spray apertures can be compensated for and corrected in that in a preferred embodiment of the device according to the invention the depth of the conical portion of the successive spray apertures varies. The desired proportioning of the spray apertures is obtained by an after-treatment, the so-called trimming, in such a manner that mutual differences of the static pressure are within a range from 1.0 to 1.5 mbar.

Another preferred embodiment of the device according to the invention is characterized by such a pitch of the spray apertures that the spray cones of adjacent spray apertures overlap each other and form a continuous spray curtain at the level of the printed board. By this measure it is achieved that the outflow pressure is substantially constant and has a substantially linear variation at a certain distance and over substantially the whole length of the spray tube.

A further preferred embodiment of the device according to the invention is characterised in that the apex angle of the conical portion of the spray apertures is 60. Very good results were obtained in experiments with a spray tube having spray apertures according to this characteristic feature.

In the known device already mentioned hereinbefore the wire-gauze cylinder comprises a longitudinal overlapping portion, for example, a folding seam, a rivetted seam or a welding seam which during rotation of the cylinder causes a periodic discontinuity in the spray pattern resulting in a disturbance of the flux distribution over the printed board.

Still another preferred embodiment of the device according to the invention is characterized by a seamless wire-gauze cylinder which is built up from wires which extend parallel to the center line of the cylinder and wires which extend concentrically about the center line of the cylinder. Due to the seamless cylinder a periodic disturbance of the spray pattern is avoided and a continuous spray image is obtained. A substantially seamless cylinder can be obtained by butt welding the concentric wires together. Regular welded joints, without burrs, can be obtained in a reproducible manner by means of laser welding, in which wire by wire is butt welded. Optimum results are obtained by using a wire-gauze cylinder woven in a circle.

BRIEF DESCRIPTION OF THE DRAWING

FIG. 1 is a diagrammatic sectional view of a device according to the invention.

FIG. 2 is a perspective exploded view of an enlarged scale of various parts of the device.

FIG. 3 is a longitudinal sectional view on an enlarged scale of the construction of the spray tube.

FIG. 4 is a front elevation on an enlarged scale of the spray tube.

FIG. 5 is a side elevation of the spray tube.

FIG. 6 is a longitudinal sectional view on an enlarged scale of a part of the wall of the spray tube at the level of the spray apertures.

FIG. 7 shows the pressure variation of the pressure p in the spray curtain, viewed over the length of the spray tube.

FIG. 8 is a perspective view on an enlarged scale of the cylinder built up from wire gauze.

DETAILED DESCRIPTION OF THE INVENTION

As is shown diagrammatically in FIG. 1 the device 1 comprises a reservoir 2 which is partly filled with flux F. A perforated cylinder 3 is accommodated in the said reservoir in such a manner that the said cylinder 3 can be rotated about its horizontal axis of rotation. By means not shown in FIG. 1 air can be blown upwards through the cylinder near the uppermost point of the cylinder so that an upwardly extending spray curtain C is formed. A plate-shaped article to be treated, for example, a printed board B, is moved during operation in the direction of the arrow A in such a manner that, viewed in FIG. 1, the lower side of the said board is hit by the drops of liquid present in the spray curtain C so as to produce a wetting of the lower side of the board with flux with a view to clean the said lower side and to further a soldering process to be carried out afterwards. Reference numeral 4 denotes a cover plate having an elongate aperture 5 for passing the spray curtain C.

This treatment of printed boards with flux is customarily used and known for the end in view, so that it may be assumed that this treatment need not be further explained here.

As is shown in greater detail in FIG. 2 the wire gauze cylinder 3 is clamped with one end on a disk-shaped part 7 by means of a clamping strap 6, which part 7 forms one assembly with a toothed wheel 8 via which the cylinder 3 can be rotated about its center line during operation by means of a driving mechanism which is not shown. The other end of the cylinder 3 is clamped to a disk 9 in a similar manner. A metal spray tube 10 is accommodated in the interior of the cylinder 3 and comprises at its top side a row of spray apertures 11 which extend in the longitudinal direction of the tube and are provided in the wall of the spray tube 10 at a regular pitch. As will further be apparent from FIGS. 2 and 3 the ends of the spray tube 10 are closed by means of sealing plates 12 and 13 and sealing rings 14 and 15, respectively, cooperating therewith. A spacer block 16 is provided in the interior of the spray tube 10 between the sealing plates 12 and 13; the sealing plates 12 and 13 and the spacer block 16 are held together by means of a draw rod 17 which is passed through the said plates and the block and is surrounded coaxially by the tube 10. A stud 18 about which the plate 7 with the toothed wheel 8 is rotatable is connected eccentrically with respect to the centre line of the tube 10 and the center line of the draw rod 17, respectively, to the sealing plate 12. In a direct line with the stud 18 a stud 19 is mounted on the sealing plate 13. The plate 9 is rotatable about the said stud 19. An air supply duct 20 is passed through the stud 19 and extends over a part of its length in the interior of the tube 10. The end of the duct 20 extending beyond the stud 19 will be connected to a source of compressed air or a source of compressed gas, or the like, not shown.

It will be obvious that the spray tube 10 supported by the studs 18 and 19 will be stationary in such a manner that the row of spray apertures 11 in the interior of the cylinder 3 will be arranged at the level of the highest point of the said cylinder.

FIGS. 4, 5 and 6 show on an enlarged scale the spray tube 10 having an outside diameter D, an inside diameter d, a wall thickness W and provided with the spray apertures 11. The center line of the spray tube 10 is denoted by X—X. As is shown in more detail in FIG. 6 each spray aperture 11 has a conical portion 21 having a depth a and an apex angle $\alpha$, as well as a cylindrical portion 22 having a depth b and a diameter c. The pitch between the successive spray apertures is denoted by s. The apex angle $\alpha$ is preferably 60°. The curve P in FIG. 7 shows the spray image or pressure variation of the static pressure p in the spray curtain measured per spray aperture and at a given distance from the spray tube 10. The maximum pressure fluctuations are within the tolerance range $\Delta p$.

As is shown in FIG. 8 the wire gauze cylinder 3 is built up from a number of longitudinal wires 23 extending parallel to the center line of the cylinder 3 and wires 24 extending at right angles to the said wires and concentrically about the centre line of the cylinder. According to the invention, the ends of the said wires 24 extending concentrically about the center line are butt welded by means of laser welding. As a result of this a seamless cylinder is obtained having a pattern of meshes which is uniform throughout its circumference.

In a device which has been tested in practice the spray tube 3 had the following dimensions:
length L: 305 mm
outside diameter D: 44.6 mm
inside diameter d: 40.6 mm
wall thickness W: 2.0 mm
depth a: ±1.7 mm (trimmed individually)
apex angle $\alpha$: 60°
depth b: ±0.3 mm (trimmed individually)
diameter c: 0.5 mm
number of spray apertures 11: 97
pitch s: 3 mm.

By means of a device having such a spray tube printed boards were provided with a flux layer in a layer thickness of the dried flux of 1 $\mu$m, the spreading being 15%. A maximum pressure gradient $\Delta p$ of 1.5 mbar was found in the measurement per spray aperture of the static pressure p at a given distance from the spray tube corresponding to the distance to the printed board to be covered.

I claim:

1. A device for providing a flux layer on a printed board, which device comprises a reservoir and a wire-gauze cylinder which is present in and rotatable in the reservoir, a spray tube extending parallel to the center line of said cylinder provided in said cylinder, an outflow aperture of an air supply duct opening into said spray tube and in which spray apertures are provided which are arranged in a row extending in the longitudinal direction of the spray tube, characterized in that the spray apertures are provided at a regular pitch in the wall of the spray tube and are conical at least over a part of their length.

2. A device as claimed in claim 1, characterised that the pitch of the spray apertures is such that the spray cones of adjacent spray apertures overlap each other and form a continuous spray curtain at the level of the printed board.

3. A device as claimed in claim 1, characterised in that the apex angle of the conical portion of the spray apertures is 60°.

4. A device of claim 1, wherein the cylinder is a seamless wire-gauze cylinder built up from wires extending parallel to the center line of the cylinder and wires extending concentrically about the center line of the cylinder.

5. A device for providing a flux layer on a printed board, which device comprises a reservoir and a wire-gauze cylinder rotatable in the reservoir, a spray tube, extending parallel to the center line of said cylinder, accommodated in said cylinder, an overflow aperture of an air supply duct opening into said spray tube, said spray tube being provided with spray apertures arranged in a row extending in the longitudinal direction of said spray tube, said spray apertures being provided at a regular pitch in the wall of the spray tube, being conical at least over a part of their length, and the depth of which conical portions of the spray apertures varying.

6. A device as claimed in claim 4, wherein the pitch of the spray apertures is such that the spray cones of adjacent spray apertures overlap each other and form a continuous spray curtain at the level of the printed board.

7. A device as claimed in claim 4, wherein the apex angle of the conical portion of the spray apertures is 60°.

8. A device of claim 4, wherein the cylinder is a seamless wire-gauze cylinder built up from wires extending parallel to the center line of the cylinder and wires extending concentrically about the center line of the cylinder.

* * * * *